United States Patent
Walsh et al.

(10) Patent No.: US 10,637,215 B2
(45) Date of Patent: Apr. 28, 2020

(54) METER STACK HEIGHT ADJUSTERS AND RELATED ASSEMBLY METHODS

(71) Applicant: Eaton Intelligent Power Limited, Dublin (IE)

(72) Inventors: Patrick Walsh, Corapolis, PA (US); Christopher Bohn, Pittsburgh, PA (US); Thomas Iseman, Lincoln, IL (US); James Lee Gehlbach, Lincoln, IL (US); Abhijeet Rathi, Khamgaon (IN)

(73) Assignee: Eaton Intelligent Power Limited, Dublin (IE)

( * ) Notice: Subject to any disclaimer, the term of this patent is extended or adjusted under 35 U.S.C. 154(b) by 25 days.

(21) Appl. No.: 16/049,143

(22) Filed: Jul. 30, 2018

(65) Prior Publication Data
US 2020/0036168 A1    Jan. 30, 2020

(51) Int. Cl.
| | | |
|---|---|---|
| H02B 1/03 | (2006.01) | |
| H02B 1/06 | (2006.01) | |
| H02B 1/20 | (2006.01) | |
| G01R 15/00 | (2006.01) | |
| G01R 22/06 | (2006.01) | |
| H02B 1/30 | (2006.01) | |
| H01R 4/30 | (2006.01) | |

(52) U.S. Cl.
CPC .............. *H02B 1/03* (2013.01); *G01R 15/00* (2013.01); *G01R 22/065* (2013.01); *H02B 1/06* (2013.01); *H02B 1/20* (2013.01); *H02B 1/306* (2013.01); *H01R 4/30* (2013.01)

(58) Field of Classification Search
USPC ........................................................ 324/142
See application file for complete search history.

(56) References Cited

U.S. PATENT DOCUMENTS

| | | |
|---|---|---|
| 5,414,590 A | 5/1995 | Tajali |
| 5,951,324 A | 9/1999 | Campbell et al. |
| 5,980,311 A | 11/1999 | Campbell et al. |
| 5,982,611 A | 11/1999 | Campbell et al. |
| 6,012,937 A | 1/2000 | Campbell et al. |
| 6,411,486 B1 | 6/2002 | Doneghue |
| 6,421,229 B1 | 7/2002 | Campbell et al. |
| 6,565,394 B2 | 5/2003 | Seff et al. |

(Continued)

OTHER PUBLICATIONS

Eaton Product Brochure "Installation Instructions for Type 1MM, 3MM, 35MM, 37MM, 35SS, and 37SS Modular Metering Centers" (4 pages) (2012) http://www.eaton.com/content/dam/eaton/products/low-voltage-power-distribution-controls-systems/meter-mounting-equipment-meter-breakers-and-group-metering/install-instructions-type-1mm-3mm-35mm-37mm-35ss-37ss-modular-metering-centers-il70-8306.pdf.

(Continued)

*Primary Examiner* — Vincent Q Nguyen
(74) *Attorney, Agent, or Firm* — Myers Bigel, P.A.

(57) ABSTRACT

Enclosures for electrical distribution systems include a height adjuster enclosure that provides connector buses and bus lines that rise from bus lines in a main terminal enclosure to connect to another enclosure such as a meter stack enclosure through the bus lines in the height adjuster enclosure. The bus lines in the height adjuster enclosure can include a three-phase bus having three vertical line conductor buses and a vertical neutral conductor bus that can be coupled to a feeder bus in the main terminal enclosure and a feeder bus in the meter stack enclosure.

27 Claims, 14 Drawing Sheets

(56) References Cited

U.S. PATENT DOCUMENTS

| | | |
|---|---|---|
| 7,358,441 B1 | 4/2008 | Seff et al. |
| 8,243,423 B2 | 8/2012 | Ranta et al. |
| 8,913,354 B2 | 12/2014 | Van Fossen et al. |
| 9,478,949 B2 | 10/2016 | Zhang et al. |
| 2010/0165550 A1* | 7/2010 | Gatti ...................... H02B 1/056 361/627 |
| 2015/0061644 A1 | 3/2015 | Parks et al. |
| 2017/0054276 A1* | 2/2017 | Zhang ...................... H02B 1/30 |

OTHER PUBLICATIONS

Eaton Product Description "Commercial Meter Stacks" (1 page) (date unknown but prior to the filing date of the present application; accessed online Jul. 10, 2018) http://www.eaton.com/Eaton/ProductsServices/Electrical/ProductsandServices/Residential/GroupMeteringandMeterBreakers/GroupMetering/CommercialMeterStacks/index.htm#tabs-1.

Eaton Product Description "Residential Meter Stacks" (1 page) (date unknown but prior to the filing date of the present application; accessed online Jul. 10, 2018) http://www.eaton.com/Eaton/ProductsServices/Electrical/ProductsandServices/Residential/GroupMeteringandMeterBreakers/GroupMetering/ResidentialMeterStacks/index.htm.

\* cited by examiner

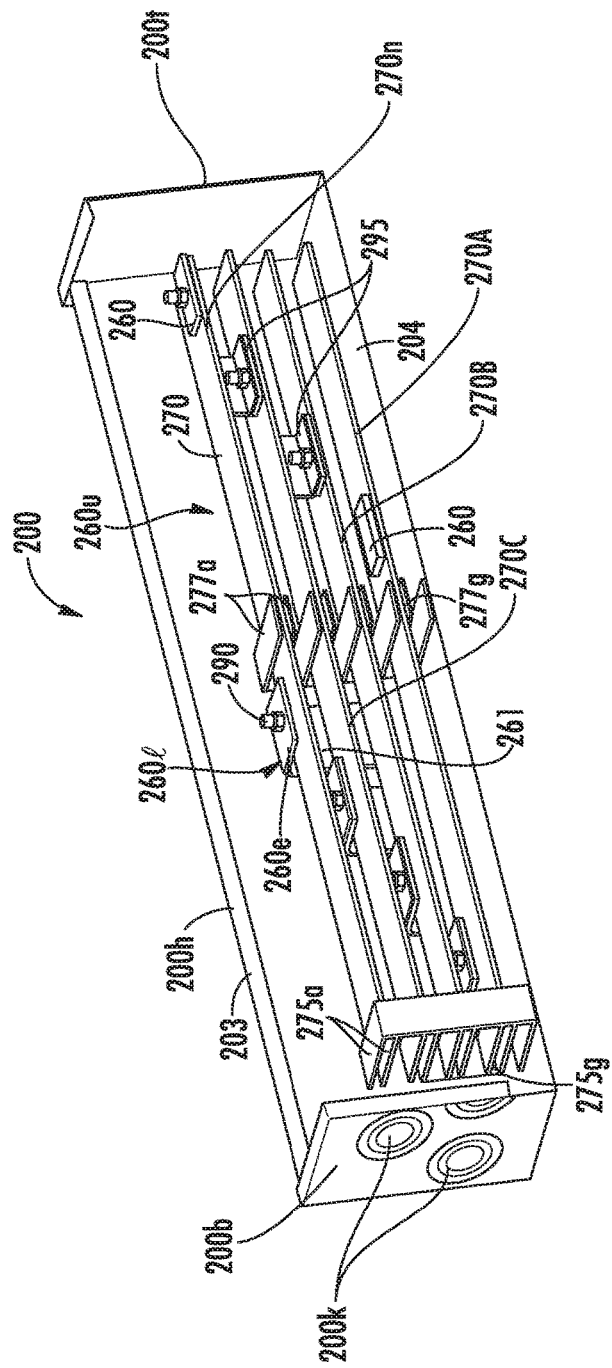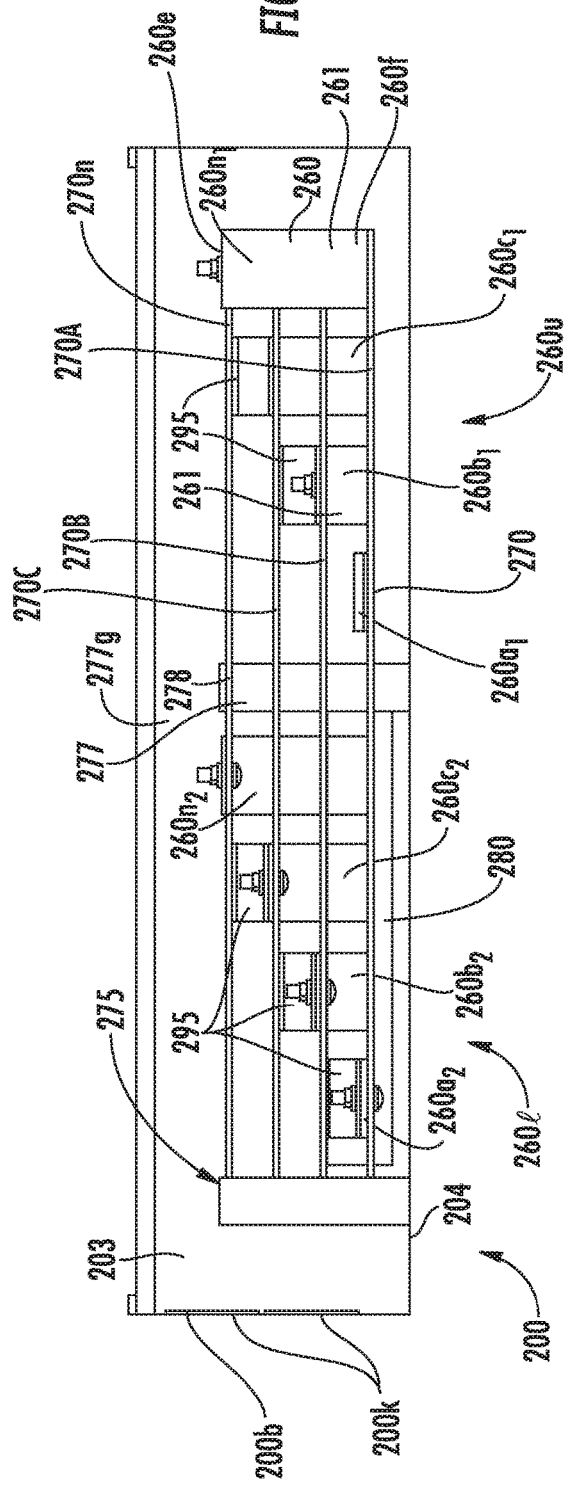

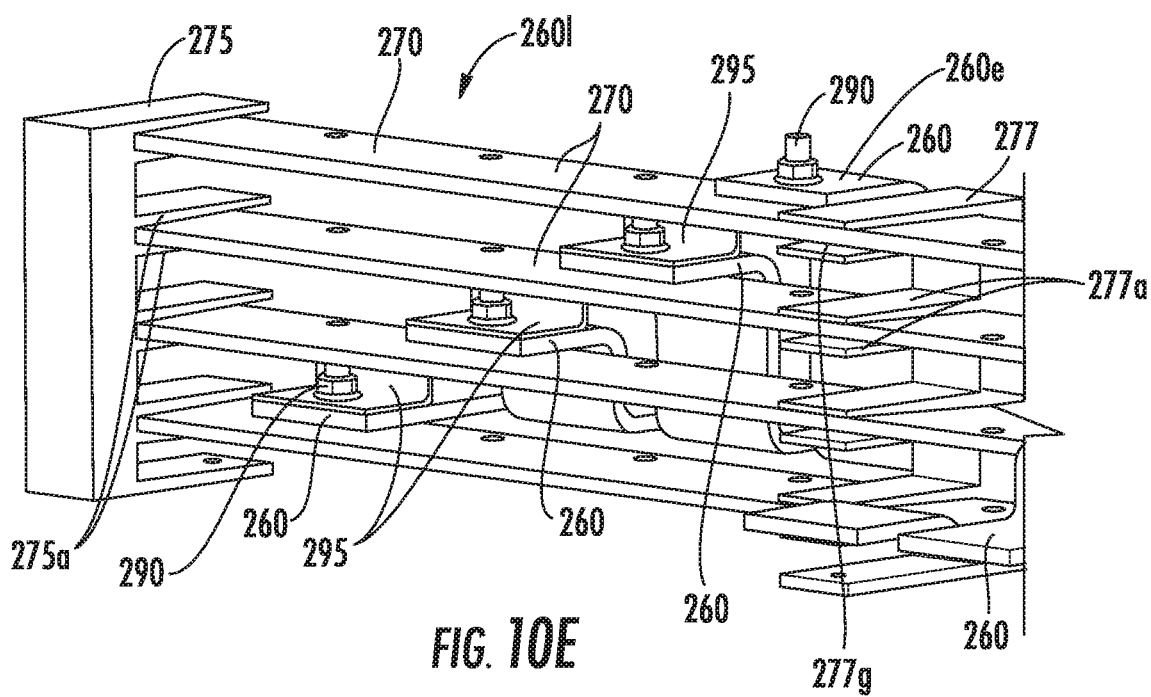

METER STACK HEIGHT ADJUSTERS AND RELATED ASSEMBLY METHODS

FIELD OF THE INVENTION

The present disclosure relates to electrical enclosures and, more particularly, to electrical enclosure assemblies including plural electrical enclosures, such as, for example, electrical distribution centers.

BACKGROUND OF THE INVENTION

Electrical equipment such as, for example, relays, circuit breakers, electric meters and transformers, are typically housed within an enclosure such as, for example, a housing, such as a box or cabinet, to protect the electrical equipment. Electrical equipment can be held in load centers that include electrical busses with conductors permitting electrical current to be carried throughout the electrical load center. Electrical busses may contain features permitting attachment of fuses, relays, switches, wires, breakers, and other electrical elements.

Buildings, such as, for example, commercial buildings and residences, typically have an electrical distribution center with one or more enclosures, such as, for example, cabinets, which house electrical equipment (e.g., without limitation, switchgear devices; relays; electric meters; transformers).

For example, meter centers are used for metering electric power delivered to multiple locations from a common system. Typically, the meter center includes an upright cabinet forming an enclosure with meters and associated disconnect switches. The meter center can include a plurality of meter compartments, with each meter compartment typically containing one meter corresponding to one location to which power is delivered. A supply bus, typically a three-phase bus having three line conductors plus a neutral conductor, extends from a feeder bus to the meter compartment. The feeder bus is electrically connected to the utility lines and extends horizontally through the rear of the cabinet. For example, tenant buses electrically connect the meter compartment to the location wherein the electrical power is utilized. The meter compartment can have a pair of vertical supply buses, or "line" buses, electrically connected to a selected pair of feeder bus phases. The line buses can include a neutral bus if the meters have a neutral connection. A meter connection is structured to mount a meter in the meter compartment for each tenant load circuit and electrically connects the meter to the supply buses and the tenant load buses.

SUMMARY OF EMBODIMENTS OF THE INVENTION

Embodiments of the present application provide a height adjuster enclosure that can reside between a main terminal device enclosure and a separate enclosure holding feeder and supply bus lines. The height adjuster enclosure provides connector buses for the feeder lines that allow the feeder lines in the main terminal device enclosure to reside above the feeder lines in the separate enclosure.

Embodiments of the invention provide devices that can accommodate max meter socket within a height standard provided by a utility company/service and can help a contractor/installer to increase wall area useable to install an additional meter or meter stack if required/desired. The wall area on which a meter stack is mounted can be a premium to a contractor and different utility companies can have different height requirements/standards for a horizontal bus connected to a feeder bus (in main terminal box) because of existing parallel/in line connection of a meter stack with the main terminal box, which, in the past, reduced the number of meter sockets that can be mounted in stack.

Embodiments of the present invention are directed to height adjusters that include a height adjuster enclosure with first, second, third and fourth walls residing between a top and a bottom and surrounding an interior chamber. The first and second walls have at least one through aperture. The height adjuster also includes a plurality of vertical buses held in the interior chamber of the height adjuster enclosure, an upper set of spaced apart connector buses in the height adjuster enclosure coupled to the vertical buses and a lower set of spaced apart connector buses coupled to the vertical buses under the upper set of spaced apart connector buses.

The plurality of vertical buses can be adjacent, parallel and spaced apart between the third and fourth walls, optionally, a width dimension of the enclosure, in a direction between the third and fourth walls, is in a range of 4-12 inches, and further optionally a depth dimension of the enclosure, that is orthogonal to the width dimension and extends in a direction between the first and second walls, is in a range of about 6-9 inches.

The bottom can include knockout panel segments. The at least one through aperture of the first wall can be aligned with the upper set of spaced apart connector buses. The at least one through aperture of the second wall can be aligned with the lower set of connector buses.

The upper set and lower set of spaced apart connector buses can each include four spaced apart connector buses, one each of the upper and lower set providing a neutral connector bus, one each of the upper and lower set providing a phase A connector bus, one each of the upper and lower set providing a phase B connector bus, and one each of the upper and lower set providing a phase C connector bus.

Each of the upper set and lower set of spaced apart connector buses can have a first end portion, and a second end portion connected by an intermediate planar body segment. The planar body segment can be orthogonal to the first end portion. The first end portion of each connector bus can be attached to one of the plurality of spaced vertical buses and the second end portion of each connector bus can be a free end portion.

Each of the upper set of connector buses can have a planar body segment with a different length from others of the upper set of connector buses. Each of the lower set of connector buses can have a planar body segment with a different length from others of the lower set of connector buses.

One of the upper set of connector buses and one of the lower set of connector buses can have a planar body segment with a common length and the common length can be a different length from lengths of a planar body segment of others of the upper and lower set of connector buses.

The height adjuster can further include at least one coupler attached to at least one of the first, second, third or fourth walls. The at least one coupler can be configured to hold the vertical bus bars in position in the enclosure. The at least one coupler can have an electrically insulating material.

The at least one coupler can be a plurality of vertically spaced apart couplers. The couplers can be monolithic rigid or semi-rigid structures of a defined shape that cooperate to hold the vertical buses in parallel alignment in the enclosure.

The at least one coupler can have a plurality of parallel arms with neighboring pairs of the parallel arms configured to sandwich a respective vertical bus therebetween to thereby hold the vertical buses in position and parallel with each other without requiring any additional fastener attached to the vertical buses.

The at least one coupler can be first and second vertically spaced apart couplers and each can have a plurality of outwardly extending parallel arms. Pairs of the parallel arms can form an open gap space therebetween that can slidably receive a respective vertical bus. The parallel arms of the first coupler can face the second wall and the parallel arms of the second coupler can face the first wall.

The height adjuster can further include an insulating member attached to a fastener coupled to one of the connector buses and one of the vertical buses and abutting a neighboring pair of the vertical buses to electrically isolate first and second buses of different phases, optionally the insulating member is a U-shaped member with sidewalls thereof abutting the neighboring pair of the vertical buses.

Yet other embodiments are directed to meter center assemblies for a residential or commercial site. The assemblies include a meter stack enclosure with a plurality of meters for measuring electric power consumption and a height adjuster coupled to the meter stack enclosure. The height adjuster includes a height adjuster enclosure with a top, bottom and first, second, third and fourth walls surrounding an interior chamber and residing between the top and bottom. The first wall and the second wall can have at least one through aperture. The height adjuster also includes a plurality of parallel vertical buses held in the height adjuster enclosure, an upper set of spaced apart connector buses in the height adjuster enclosure coupled to the vertical buses and a lower set of spaced apart connector buses coupled to the vertical buses under the upper set of spaced apart connector buses.

The lower set of the connector buses can be coupled to feeder buses of the meter stack enclosure.

The meter center assembly can further include a main terminal enclosure with feeder buses coupled to at least one utility or private power line. The upper set of the connector buses is connected to the feeder buses.

Optionally the height adjuster enclosure can have a depth dimension in a direction between the terminal device enclosure and the meter stack enclosure (e.g., between the first and second walls) in a range of about 6 to about 9 inches. Optionally the height adjuster holds the plurality of vertical buses laterally spaced apart, aligned and parallel to each other between the third and fourth walls.

The bottom can have knockout panel segments. The at least one through aperture of the first wall can be aligned with the upper set of spaced apart connector buses and the at least one through aperture of the second wall can be aligned with the lower set of connector buses.

The upper set and lower set of spaced apart connector buses can each comprise four spaced apart connector buses, one each of the upper and lower set providing a neutral connector bus, one each of the upper and lower set providing a phase A connector bus, one each of the upper and lower set providing a phase B connector bus, and one each of the upper and lower set providing a phase C connector bus.

The height adjuster can further include at least one coupler attached to at least one of the first and second sidewalls. The at least one coupler can be configured to hold the vertical bus bars in position in the enclosure. The at least one coupler can be formed of an electrically insulating material.

The height adjuster can further include at least one insulating member attached to a fastener coupled to one of the connector buses and one of the vertical bus bars and abutting a neighboring pair of the vertical buses to electrically isolate vertical buses of different phases, optionally the insulating member is a U-shaped member with sidewalls thereof abutting the neighboring pair of the vertical buses.

The at least one coupler can include first and second vertically spaced apart couplers that each comprise a plurality of parallel arms with neighboring pairs of the parallel arms configured to sandwich a respective vertical bus therebetween. Optionally, pairs of the parallel arms form an open gap space that can slidably receive a respective vertical bus therebetween to thereby hold the vertical buses in position and parallel with each other without requiring any additional fastener attached to the vertical buses and optionally the pairs of the parallel arms with the open gap space of the first coupler faces the second wall and the pairs of parallel arms with the open gap space of the second coupler faces the first wall.

Yet other embodiments are directed to methods of installing a meter center stack to a main terminal device coupled to at least one power line of a private or public power grid. The methods include: providing a height adjuster comprising an enclosure with upper and lower sets of connector buses and vertical buses in the enclosure; coupling the lower set of the connector buses to feeder buses of the meter stack; and coupling the upper set of the connector buses to feeder buses of the main terminal device before or after coupling the lower set of the connector buses, optionally the enclosure of the height adjuster can have a depth dimension that is in a range of 6-9 inches.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 5A is an isometric side, bottom view of an example height adjuster (with a sidewall and front wall omitted and upper set of bus connectors truncated for ease of viewing internal components) according to embodiments of the present invention.

FIG. 5B is a side view of the device shown in FIG. 5A, again without the front wall and one sidewall.

FIG. 10E is an enlarged partial side perspective view of the device shown in FIG. 10B.

DETAILED DESCRIPTION OF EMBODIMENTS OF THE INVENTION

Figure 1:
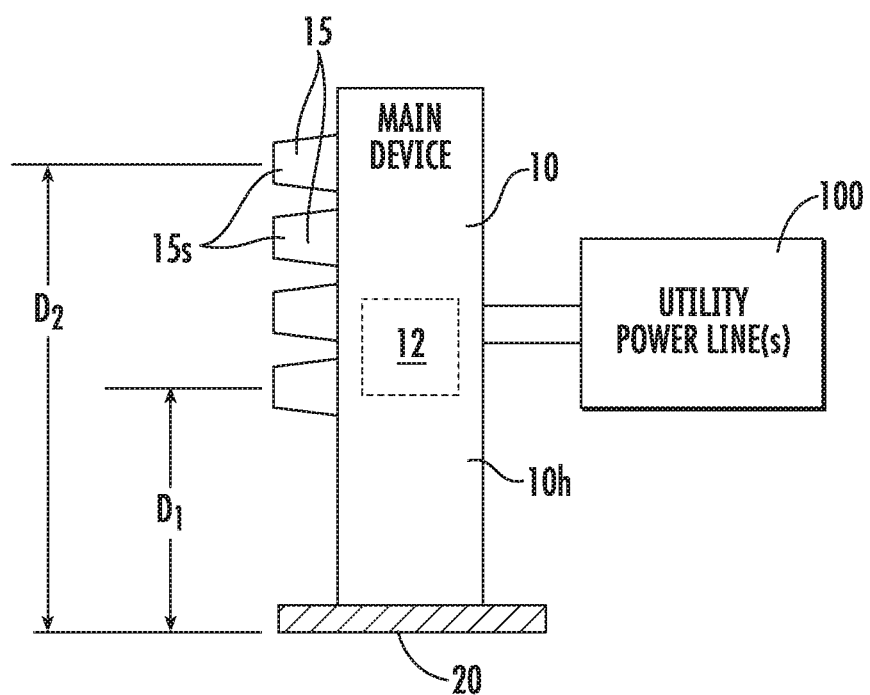
FIG. 1 is a schematic illustration of a main terminal device with dimensional height constraint(s) imposed by different utility providers.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'''). The terms "Fig." and "FIG." may be used interchangeably with the word "Figure" as abbreviations thereof in the specification and drawings. In the figures, certain layers, components or features may be exaggerated for clarity, and broken lines illustrate optional features or operations unless specified otherwise.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly. Thus, directional phrases used herein, such as, for example, left, right, front, back, top, bottom and derivatives thereof, relate to the orientation of the elements shown in the drawings and are not limiting upon the claims unless expressly recited therein.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the invention are particularly suitable for electrical devices such as load centers and/or meter breakers. The terms "load center" and "electrical distribution load center" refer to the collective components of an electrical distribution system and its respective housing that supplies electrical power to one or more subsidiary circuits. The terms "bus," "bus element," "electrical distribution bus," or "bus bar" refers to components in an electrical distribution system that conducts electricity from one location to another location within the load center.

As employed herein the term "switchgear device" shall include, but not be limited by, a circuit interrupter, such as a circuit breaker of fused switch device (e.g., without limitation, low-voltage or medium-voltage or high-voltage circuit breakers); a contactor; a motor controller/starter; and/or any suitable device which carries or transfers current from one place to another.

For purposes of illustration, embodiments of the invention will be described as applied to meter stacks and a main terminal for enclosing electrical equipment (e.g., without limitation, relays, circuit breakers, electric meters, transformers), although the enclosures and/or door systems may also be applied to other types of enclosures for electrical power distribution and can be adapted for one or both indoor and outdoor, weather-resistant use.

The term "meter stack" refers to meters that are stacked, at least one above another. The meters can be vertically aligned or offset. The meters can be provided as stacks in two separate but side by side adjacent meter center enclosures. The meter stack can also be referred to as a "meter center" for distributing electric power to and measuring electric power consumption by a plurality of individually measured units in a residential and/or commercial building. Meter centers can optionally be expandable or "gangable." That is, meter centers can be capable of being ganged (i.e., grouped, attached, or coupled) together such that they are electrically and mechanically coupled with one or more other meter centers. For example, adjacent meter centers can be attached using male/female connectors, which may or may not be reinforced with mechanical bolts or other mechanical fasteners. Such gangable meter centers allow for addition and removal of meter centers and main service modules to accommodate differing electric power metering and distribution needs. See, e.g., U.S. Pat. No. 8,243,423, the contents of which are hereby incorporated by reference as if recited in full herein.

Referring to FIG. 1, a main terminal device 10 is electrically connected to at least one power line 100, i.e., of a power grid or other power source. The power line 100 can connect to an external public utility or grid, a private power grid, generators or other power source(s).

The main terminal device 10 includes an enclosure 10h and meter connectors 15 which can be meter sockets 15s. The meter connectors 15 are structured to input a power circuit from a power source and to engage a power meter. The enclosure 10h can further include a circuit interrupter, such as a main circuit breaker 12. See, e.g., U.S. Pat. Nos. 5,951,324; 5,980,311; 5,982,611; 6,012,937; 6,411,486; 6,421,229; 6,565,394; 7,358,441; and 8,913,354 which are incorporated by reference herein. The main terminal device can also be referred to as a "main service module" as is known to those of skill in the art.

Every utility company (or indeed private power grids) can specify a minimum height $D_1$ and a maximum height $D_2$ relative to upper and lower meter sockets 15 of a respective main terminal device 10, both measured from a support surface 20 such as a final grade/platform outdoors or to a floor. Thus, with the main terminal device 10 at a specified height (per utility), a meter stack 50 (FIGS. 2A, 2B) may be limited with less than a desired number of meters (i.e., 4 meters rather than 6 meters) that can be installed due to the height constraint: $D_1$ and $D_2$, minimum and maximum meter socket height from base 20.

Figure 2A:
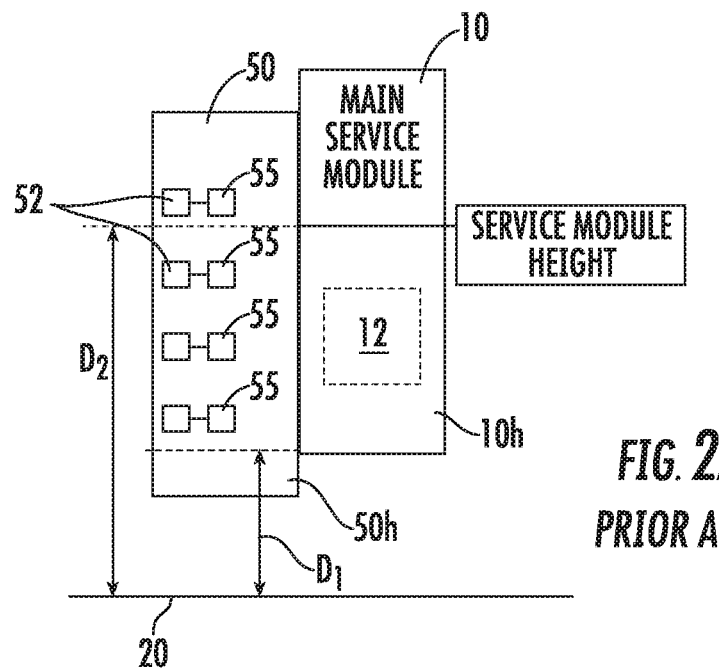
FIG. 2A is a schematic illustration of an example prior art four meter stack coupled to a main terminal device in compliance with the height constraint(s).
Figure 2B:
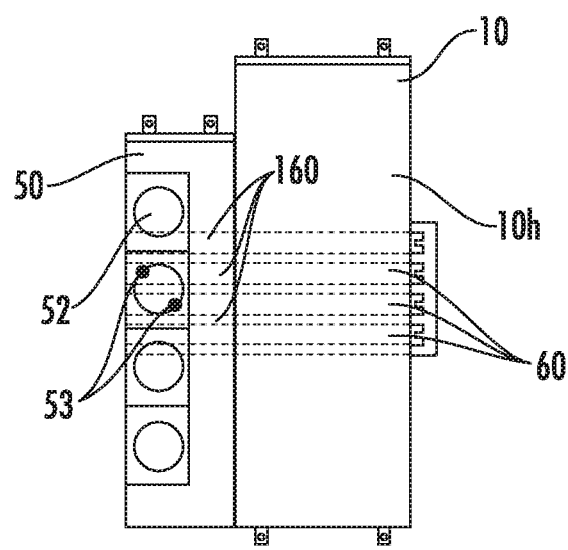
FIG. 2B is another schematic illustration of an example prior art meter stack coupled to the main terminal device.

Referring to FIGS. 2A and 2B, the meter stack 50 can include a plurality of stacked meters 52, each in electrical communication with a disconnect switch 55 such as a circuit breaker in a meter stack enclosure 50h. The meter stack 50 and main terminal device 10 can be configured as a gangable metering system. The main terminal device 10 can have an enclosure 10h that encloses a main disconnect switch 12 such as a main or primary circuit breaker, a fusible switch, or a bolted pressure switch. The meter stack 50 can have an enclosure 50h that holds and/or encloses multiple meters 15 in one enclosure 50h. The meter stack 50 can have phase connectors 53 for each meter 52. Feeder buses 60 in the main terminal device 10 can connect to feeder buses 160 in the meter stack 50. See, e.g., U.S. Pat. Nos. 6,421,229 and/or 8,913,354 for a description of exemplary metering apparatus, the contents of which are hereby incorporated by reference as if recited in full herein.

In the past, as shown in FIGS. 2A and 2B, the meter stack enclosure 50 directly connects to the main terminal device 10. Also, in the past, if a customer has a requirement of six meters 52, but due to the minimum and maximum height constraint from the utility, only a three or four meter stack 50 can be used, to meet the requirement of six meters, a second meter stack enclosure with additional meters (i.e., an additional 3 meter stack) can be been installed.

Figure 3:
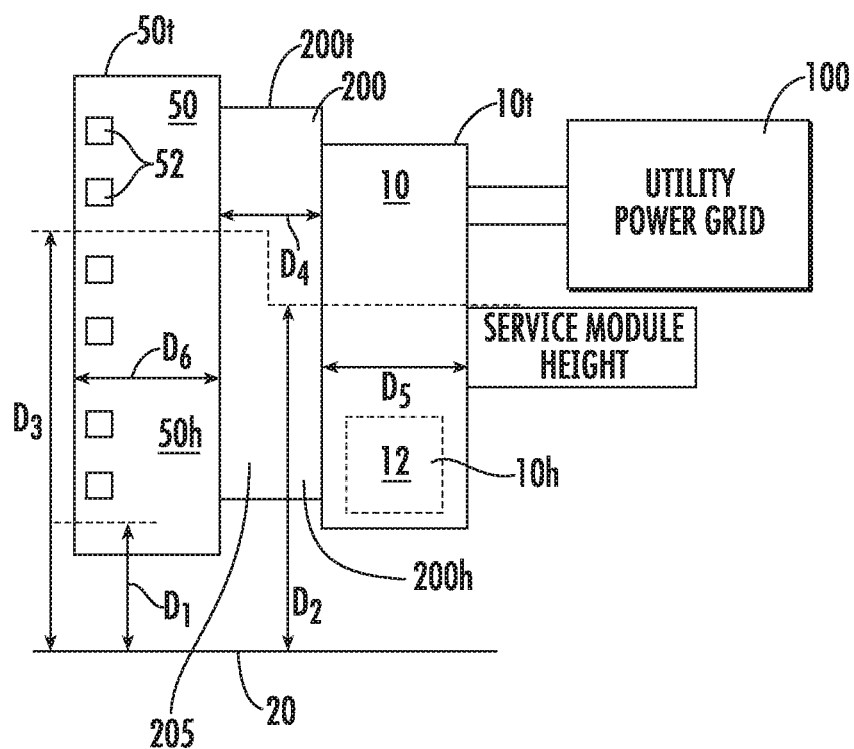
FIG. 3 is a schematic illustration of an example height adjuster sandwiched between a meter stack and a main terminal device according to embodiments of the present invention.

Referring to FIG. 3, according to embodiments of the present invention, a height adjuster 200 can be placed between the enclosure 10h of the main terminal device 10 and the enclosure 50h of the meter stack 50 allowing the use of a single meter stack 50 with a desired number of meters 52, such as, for example, a six meter stack. The height adjuster 200 can increase the allowed maximum height of a socket constraint to $D_3$, which is greater than $D_2$. A supply bus 270 (FIG. 4) in the height adjuster 200, typically a three-phase bus having three vertical line conductor buses and a vertical neutral conductor bus, is coupled to the feeder bus 60 (FIG. 4) in the main terminal device 10 and the feeder bus 160 (FIG. 4) in the meter stack 50.

A top 50t of the meter stack enclosure 50h can reside above (FIG. 3) or flush with (FIG. 4) a top 10t of the enclosure 10h of the main terminal device 10. A top 200t of the enclosure 200h of the meter height adjuster 200 can reside above (FIG. 3) or flush with (FIG. 4) the top 10t of the main terminal device 10 as well. The top 200t of the enclosure 200h can reside below the top 50t of the meter stack enclosure 50h as shown. However, the top 200t can alternatively reside even with or above the top 50t of the meter stack enclosure 50h.

Figure 4:
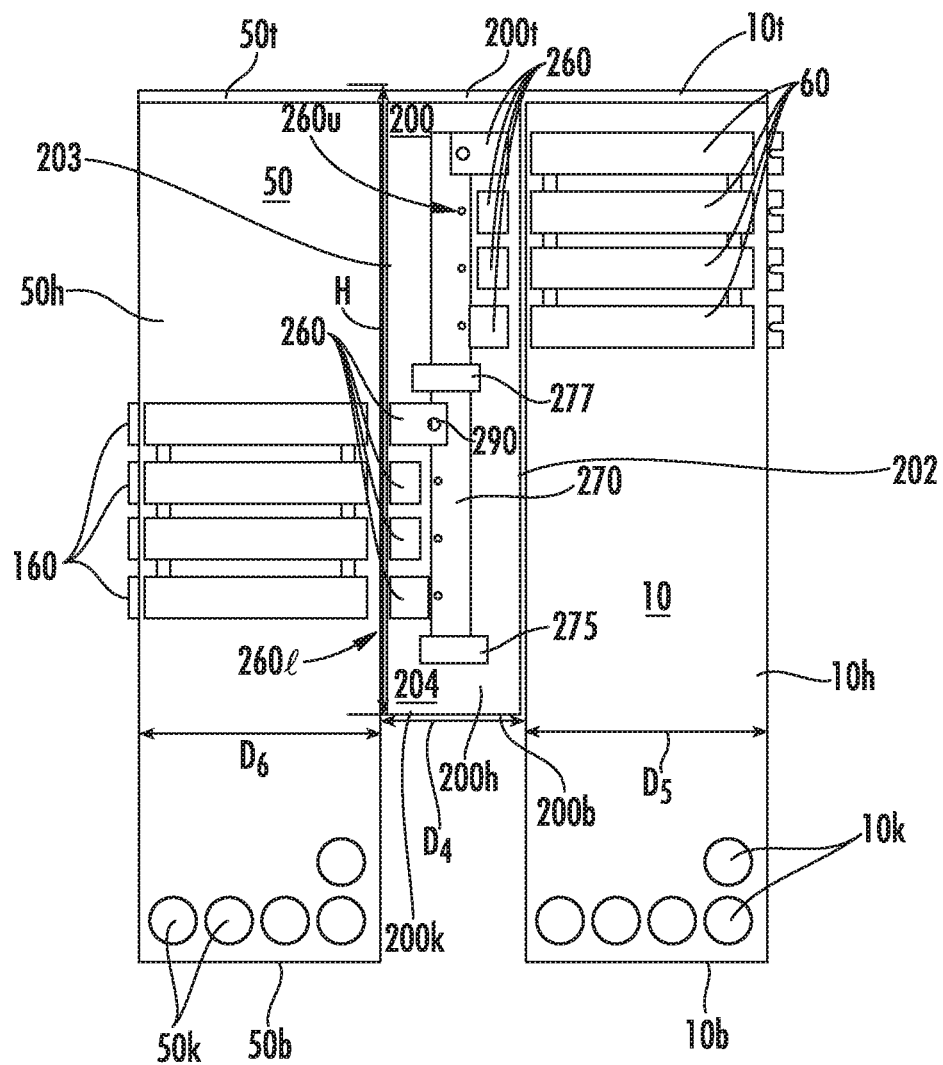
FIG. 4 is a front view of a metering stack and height adjuster assembly (shown without a front cover to illustrate internal components) according to embodiments of the present invention.

Referring to FIGS. 3 and 4, the height adjuster 200 can have a depth dimension $D_4$ (in a direction between the terminal device 10 and the meter stack 50) that is less than a depth dimension $D_5$ and/or $D_6$ of either or both the main terminal device 10 and the meter stack 50. The dimension $D_4$ can be at least 30% less, such as between about 30% to about 80% less than the depth dimension $D_5$ and/or $D_6$, in some embodiments. In some particular embodiments, the height adjuster enclosure 200h can have a height H that is in a range of about 30 to about 40 inches.

Figure 6:
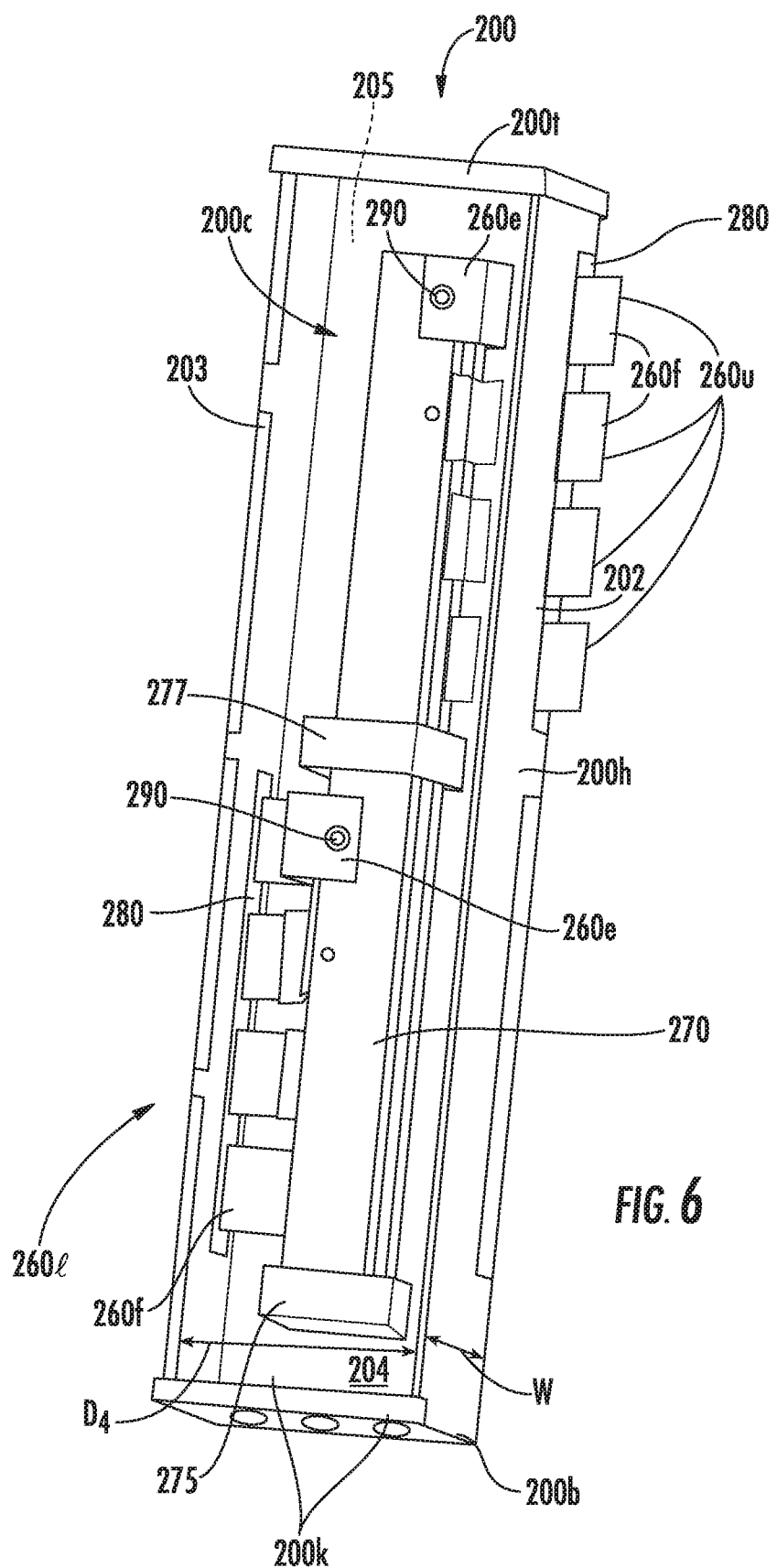
FIG. 6 is a side perspective view of the device shown in FIG. 5A, omitting one sidewall.
Figure 7B:
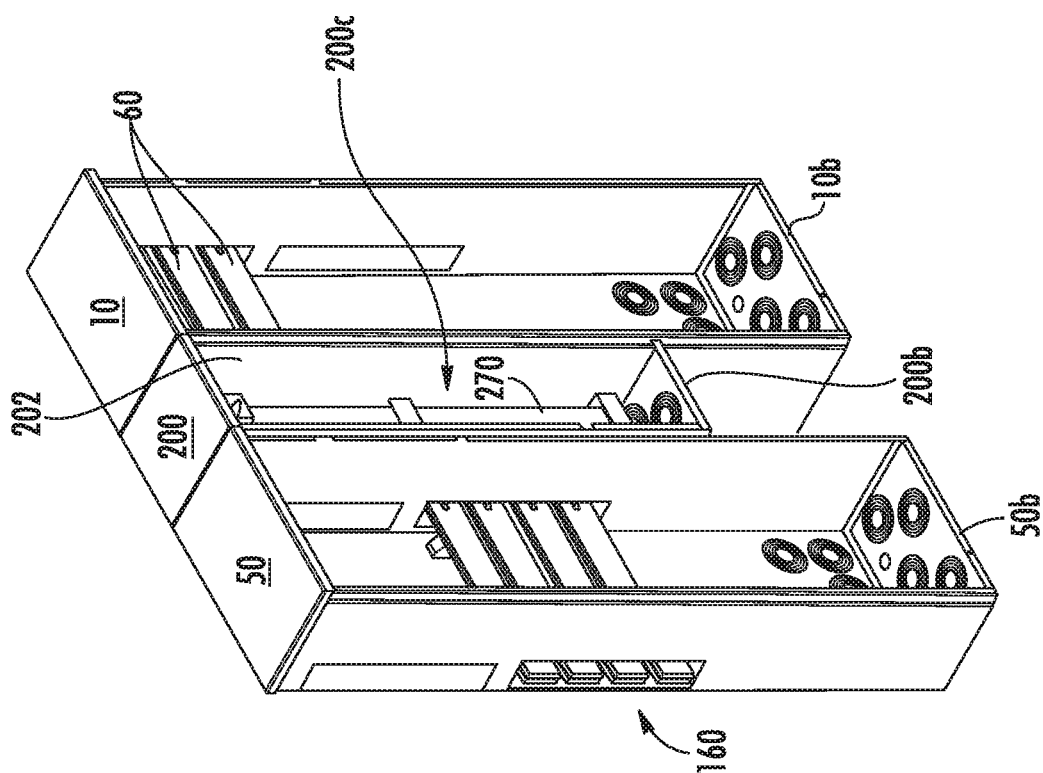
FIGS. 7A and 7B are front, isometric views of a metering stack and height adjuster assembly (shown without a front cover to illustrate internal components) according to embodiments of the present invention.
Figure 7A:
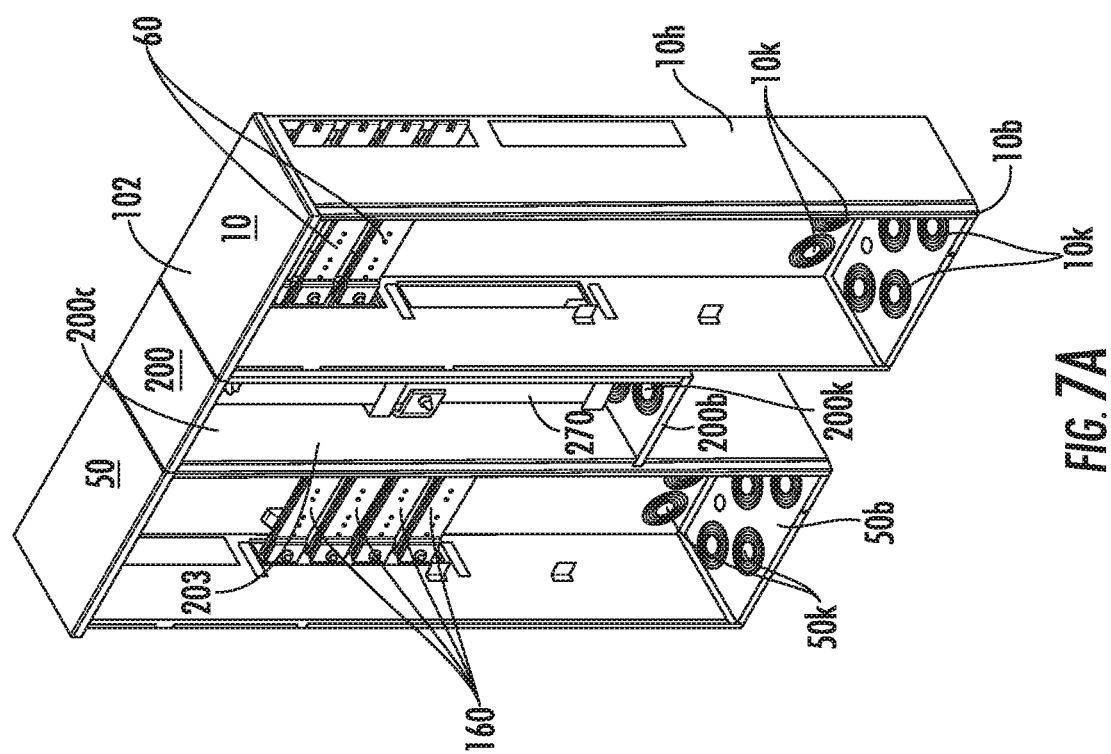

Referring to FIG. 6, the height adjuster enclosure 200h can be compact with a depth dimension $D_4$ that is in a range of about 4 to about 12 inches, more typically in a range of about 6 to about 8 or 9 inches. The depth dimension $D_4$ corresponds to the dimension in a direction between the first wall 202 and the second wall 203, i.e., between terminal device 10 and the meter stack 50. The enclosure 200h may also have a width or lateral dimension "W" (orthogonal to the depth dimension) that is in a range of about 4-12 inches. As shown, the height adjuster enclosure 200h can hold vertical buses 270 to be in adjacent parallel planes inside the enclosure 200h aligned in a column between the first wall 202 and the second wall 203 and/or between the meter stack 50 and terminal device 10.

Referring to FIG. 4, the height adjuster 200 holds connector bus bars 260 and the vertical buses 270. The connector bus bars 260 can be orthogonal to the vertical buses 270. The connector bus bars 260 can have a horizontal length and the vertical buses 270 can have a vertical length that is much greater than the horizontal length of the connector bus bars 260, typically at least 50% greater length and can have a 2×-10× greater length. In some particular embodiments, the vertical buses 270 have a vertical length that is in a range of about 25-37 inches while the connector bus bars 260 have a horizontal length that is in a range of about 4-12 inches, more typically in a range of about 4-8 inches. The term "connector bus bars" 260 is interchangeably used with "connector buses" 260 herein.

The connector bus bars 260 can be provided as an upper set 260u and a lower set 260l of connector bus bars 260, with one set facing the main terminal device 10 and the other set facing the meter stack 50. As shown, the upper set 260u can include four horizontal connector bus bars that face the main terminal device 10 and the lower set 260l can include four horizontal connector bus bars that face the meter stack 50. As shown, the lower set 260l can connect to respective feeder bus bars 160 in the meter stack enclosure 50h and the upper set 260u can connect to respective feeder bus bars 60 in the main terminal device 10. As also shown, the feeder bus bars 160 in the meter stack 50 can reside below feeder buses 60 in the main terminal device 10.

Figure 5C:
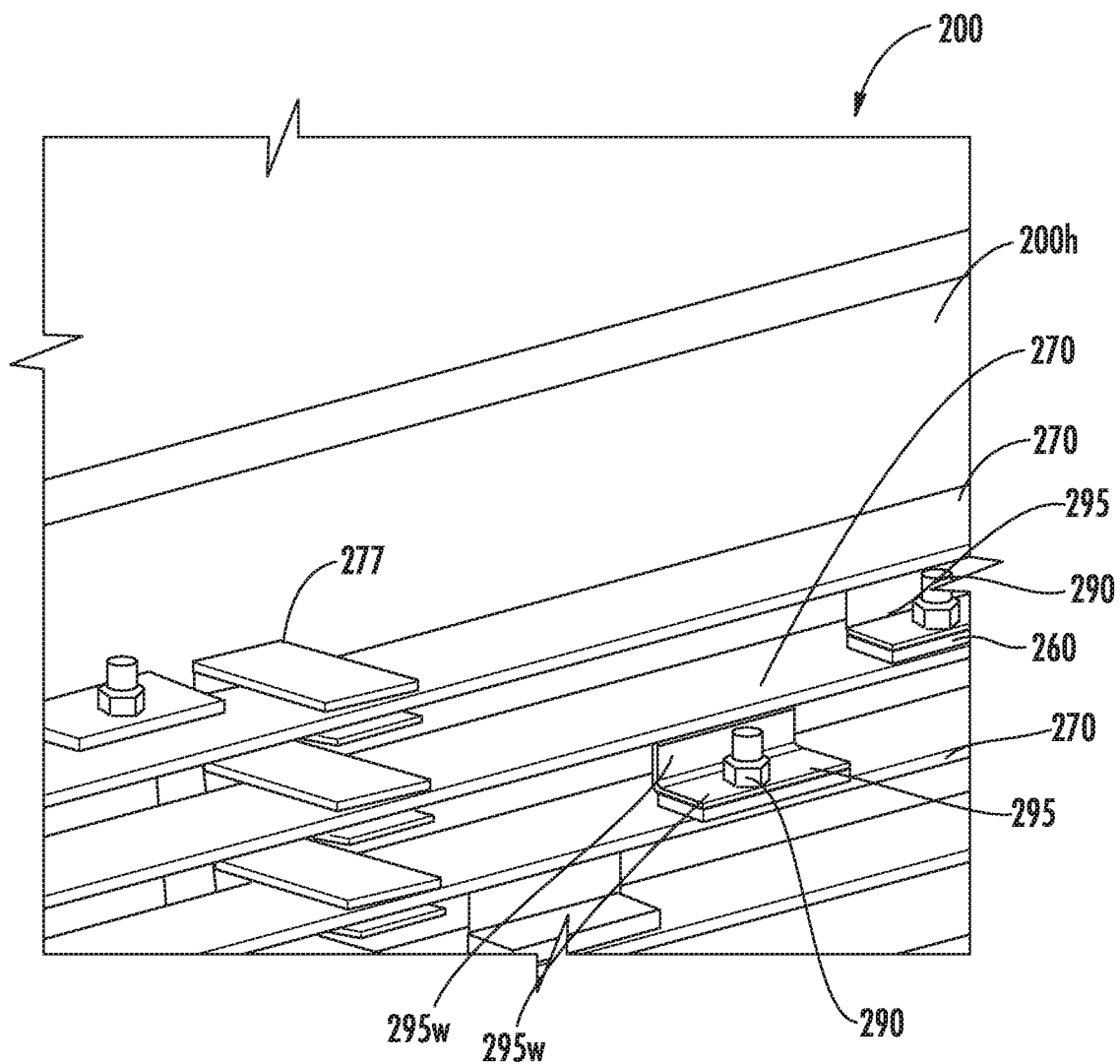
FIG. 5C is an enlarged partial view of the device shown in FIG. 5A.

Different ones of the connector bus bars 260 can connect to different vertical buses 270 for each different phases (i.e., phases A, B, C) and optionally a neutral. FIGS. 5A and 5B illustrate exemplary vertical buses 270n (neutral), 270A (phase A), 270B (phase B) and 270C (phase C). As shown, each of the vertical buses 270 are connected to two vertically spaced apart connector bus bars 260, one in the upper set 260u and one in the lower set 260l providing an electrical path that is horizontal, then vertical along a segment of the vertical bus 270, then horizontal to engage the feeder bus bars 60 and 160 using pairs of first and second connector buses 260 for each phase: $260a_1$, $260a_2$ for phase A vertical bus 270A; $260b_1$, $260b_2$ for phase B vertical bus 270B; $260c_1$, $260c_2$ for phase C vertical bus 270C; and $260n_1$, $260n_2$ for neutral vertical bus 270n.

Referring to FIGS. 4, 7A, 7B, and 8A, the height adjuster 200 may have an overall height dimension H that is less than the meter stack 50 and/or main terminal 10. The bottom 200b of the height adjuster 200 can reside above a bottom 10b of the main terminal device 10 and/or a bottom 50b of the meter stack 50. Knockout segments 10k, 50k, 200k can be provided in each of the respective enclosures 10h, 50h, 200h. The knockout segments 10k, 50k, 200k can allow installers to selectively remove one or more of these segments to route cables and/or wiring into/out of the respective enclosures.

Referring to FIGS. 5B, 6, and 10A-10E, each connector bus bar 260 can have a first end portion 260e that is affixed to the corresponding vertical bus 270 with a fastener 290 such as a bolt, screw or other fixation member, and an opposing second end portion that provides a free end 260f that can connect to a respective adjacent feeder bus line 60 or 160, at installation.

Referring to FIGS. 5A-5C and 10A-10E, the height adjuster 200 can include an electrically insulating member 295 that can be attached to a respective fastener 290 and reside between adjacent pairs of two vertical buses 270 of different phases to electrically isolate the two buses of different phases. The electrically insulating member 295 can have a "U" shape with outer walls 295w thereof residing between (in abutting contact with) and parallel to adjacent pairs of the two vertical buses 270.

The electrically insulating member 295 can reside on a subset of the vertical buses 270 for a subset of the connector bus bars 260, such as two or three of the upper and/or lower set of connector bus bars 260u, 260l, respectively. One or both of the outermost and innermost vertical buses 270 may not require the use of the insulating member 295. The electrically insulating member 295 can be rigid, semi-rigid, malleable or flexible (i.e., not able to have a self-supporting "U" shape until assembled). The term "semi-rigid" means that the member 295 has a desired end use self-supporting shape prior to assembly but may flex upon contact with a vertical bus 270. The electrically insulating member 295 can comprise one or more of MYLAR® polyester film from Dupont Tejfin Films or other resin Polyethylene Terephthalate (PET) film or material, sandpaper, or plastic or polymer material. The electrically insulating member 295 can comprise an overmolded insulating material on an insulating substrate. The electrically insulating member 295 can be formed using a monolithic single layer electrically insulating material or a laminated or multiple-layer of electrically insulating materials of the same or different material content.

Referring to FIGS. 5A, 5B and 10A-10E, the bus connectors 260 can have a flat body segment 261 with different lengths between the first and second end portions 260e, 260f for different ones. The term "flat body segment" 261 can interchangeably be referred to as "planar body segment" 261. As shown in FIG. 5B, the neutral bus connectors $260n_1$, $260n_2$ have a flat body segment 261 with a greater length than the length of the other bus connectors for the different current phases. However, bus connectors 260 for one of the different phases may have the greater length and the neutral bus connector can have a lesser length. The free ends 260f can terminate along a common plane. One or both of the end portions 260e, 260f can be perpendicular to the flat body segment 261.

Referring to FIGS. 6, 7A, 7B, 8A and 9A, for example, the enclosure 200h of the height adjuster 200 can comprise at least one vertically extending elongate aperture 280 on each of a first wall 202 and a second wall 203 of the enclosure that allows a free end 260f of the connector buses 260 to couple to feeder buses 60, 160, respectively. The free end 260f may extend a distance out of the enclosure via the aperture(s) 280 or a free end of a connector of the feeder buses 60, 160 may project a distance to enter the aperture(s) 280. Although shown as a single elongate aperture 280 that allows four connectors to extend therethrough, the wall may have a single aperture for each such connector segment or pairs of connector segments (not shown).

As shown in FIGS. 5B, 6, 9B and 9C, the aperture 280 can be rectangular and oriented in use with the long sides vertical and the short sides horizontal. The side or wall facing the terminal device (FIG. 9B) may have upper and lower apertures 280u, 280l while the side or wall facing the meter stack (FIG. 9C) may have a single aperture 280, located below the upper aperture 280u of the other side.

Referring to FIGS. 4, 6, 7A, 7B, and 8A, for example, the enclosure 200h can have a first wall 202, a second wall 203, a third wall 204 and a fourth wall 205 (the fourth wall can be a front cover and is omitted from these views but shown schematically in FIG. 3) that surround an open interior chamber 200c and that reside between the top 200t and bottom 200b. The vertical buses 270 can be spaced apart in different planes, stacked laterally spaced apart between the third wall 203 and the fourth wall 204. In some embodiments, the vertical buses 270 may reside closer to one of the walls than the other, as shown in FIGS. 5A and 5B, for example. Two of the walls, shown as the first and second walls 202, 203, can have the at least one open through aperture 280 offset vertically from each other, while the other two walls can be contiguous without any aperture for the bus connectors 260.

Figure 9A:
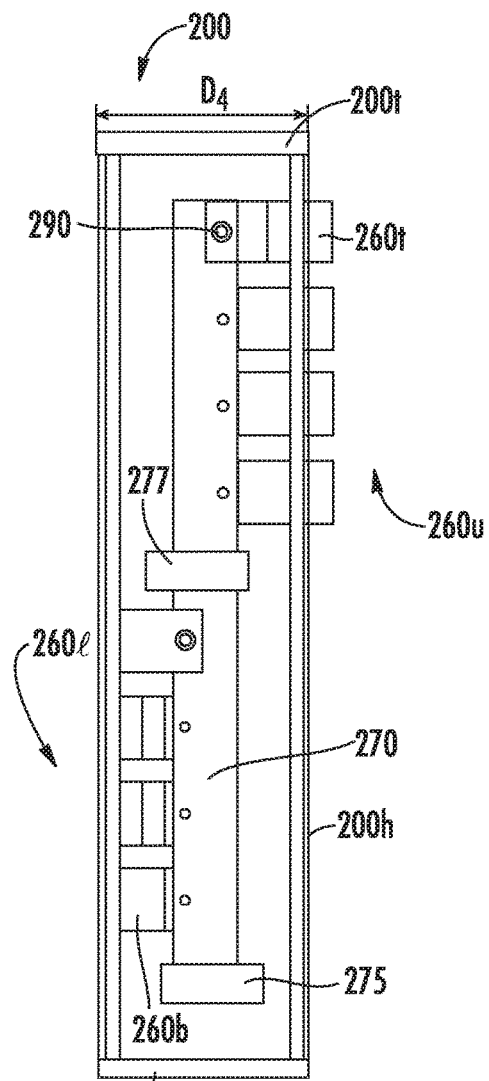
FIG. 9A is a front view (without the front cover) of an example height adjuster according to embodiments of the present invention.
Figure 9B:
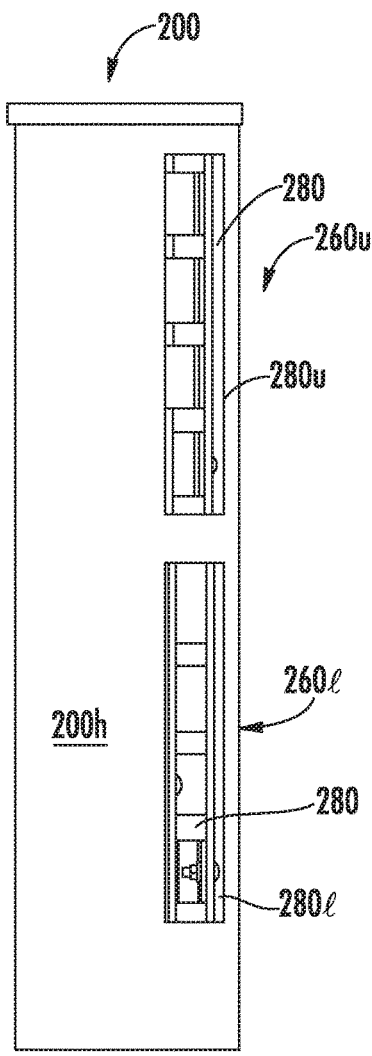
FIGS. 9B and 9C are opposing side views of the device shown in FIG. 9A.
Figure 9C:
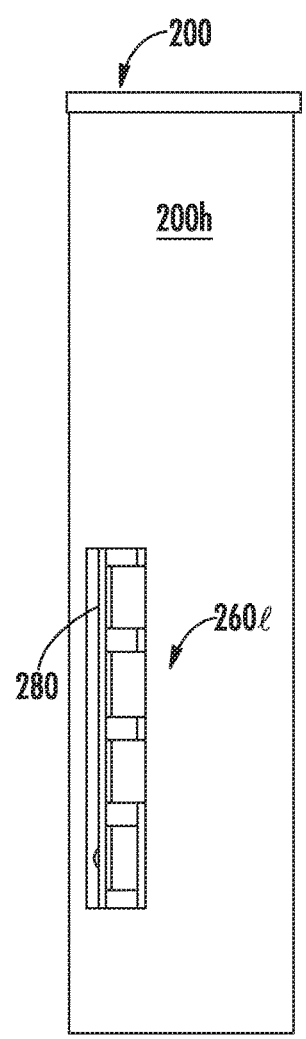
Figure 10A:
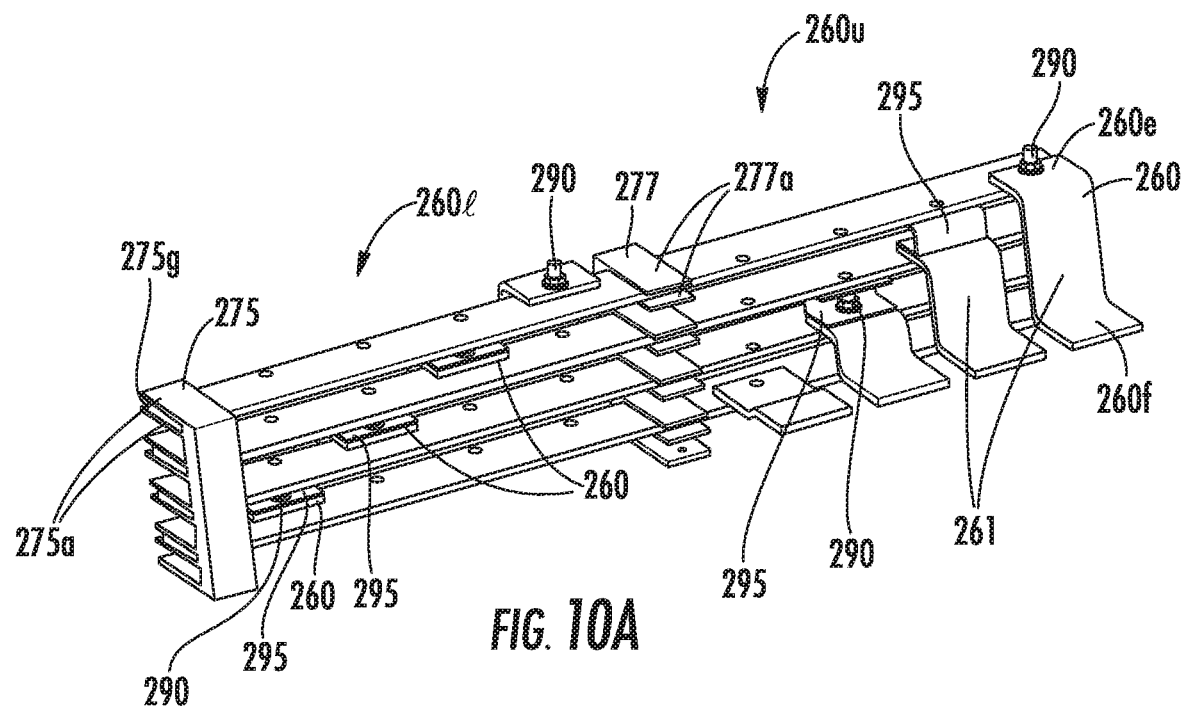
FIG. 10A is a side perspective view (the side facing the terminal device) of components of a height adjuster (without the enclosure) according to embodiments of the present invention.
Figure 10B:
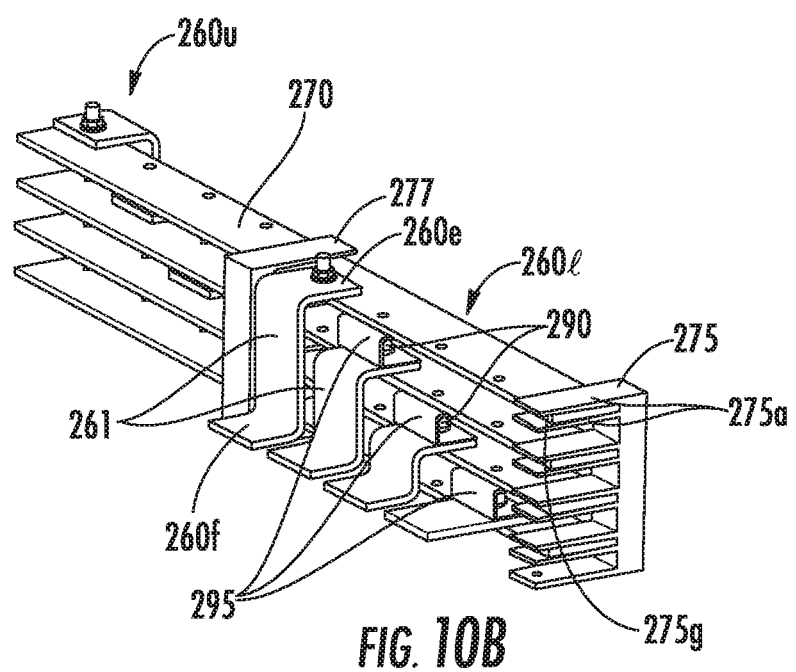
FIG. 10B is a side perspective view (the side facing the meter stack assembly) according to embodiments of the present invention.
Figure 10C:
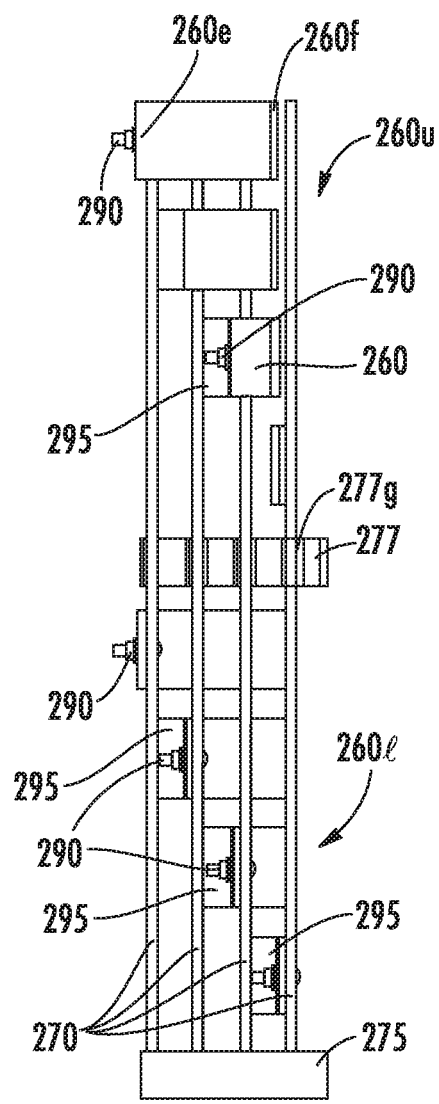
FIG. 10C is a side view of the device shown in FIG. 10A.
Figure 10D:
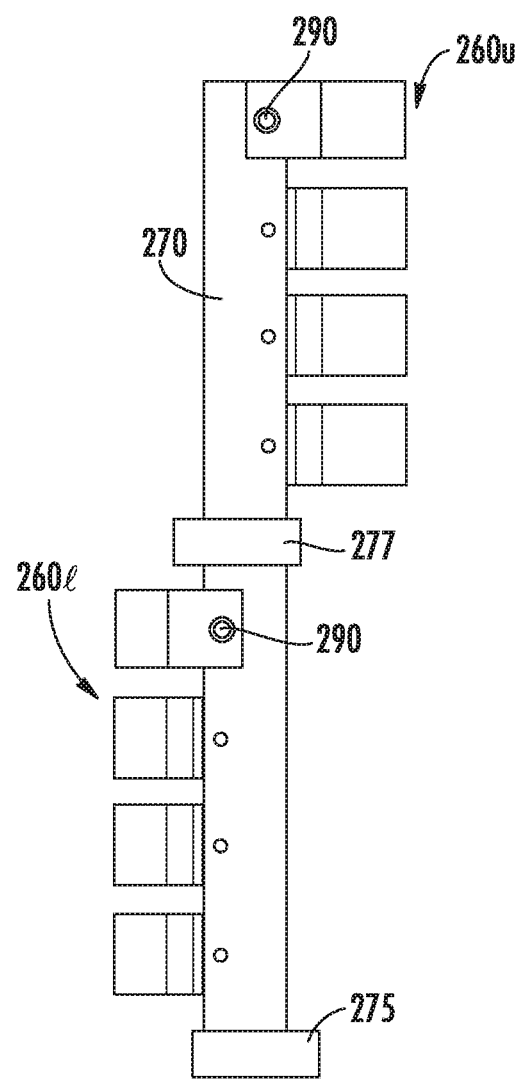
FIG. 10D is a front view of the device shown in FIG. 10A.

In some embodiments, as shown in FIG. 9A, the top connector bus 260t can reside closer to the top of the housing 200t than the bottom connector bus 260b resides from the bottom of the housing 200b.

Also, as shown in FIGS. 5A, 5B, 6, and 10A-10E, the height adjuster 200 can comprise at least one electrically insulating coupler 275 or 277, shown as a plurality of vertically spaced apart electrically insulating couplers 275, 277 that hold the vertical buses 270 in parallel alignment in the enclosure 200h.

The plurality of couplers 275, 277 are shown as comprising first and second couplers that can have parallel arms 275a, 277a that sandwich a respective vertical bus therebetween as shown in FIGS. 5A, 10A, 10B and 10E, for example. Pairs of the arms 275a and 277a can form an open gap space 275g, 277g that can slidably receive a respective vertical bus 270. The open gap space 275g of the first coupler 275 can face the meter stack enclosure 50h while the open gap space 277g of the second coupler 277 can face the main terminal device 10.

At least one arm 275a, 277a of each coupler 275, 277 (shown as a single arm) can be attached to a wall (shown as the same wall but different walls may be used) of the enclosure 200h. One of the couplers 275 can reside adjacent the bottom 200b of the enclosure 200h and the other can reside at a spaced apart medial location. Other number or configurations of couplers may be used. The couplers 275, 277 can be of a suitable grade polymeric or plastic material, such as, for example a glass resin reinforced thermoset material and/or a structural thermoset sheet molding compound (SMC) optionally IDI-E204 SMC from IDI Composites International, Noblesville, Ind.

Referring to FIGS. 5A, 5B, 9A, and 10A-10E, for example, the at least one coupler 275 or 277 can hold the vertical bus bars 270 without requiring any fixation members or fasteners, such as screws or bolts, that attach directly to the vertical buses 270. Parallel adjacent arms 275a and/or 277a can frictionally engage one vertical bus bar 270.

The height adjuster 200 can require a reduced wall space for various installations over conventional cooperating meter stack and main terminal systems.

The height adjuster 200 allows for a taller meter stack 50 (FIGS. 3, 4) with an increased number of stacked meters 52 in one enclosure 50h (i.e., a six meter stack) that can be used in place of a shorter meter stack in one enclosure 50h (FIGS. 2A, 2B) with less stacked meters (i.e., a four meter stack).

Figure 8C:
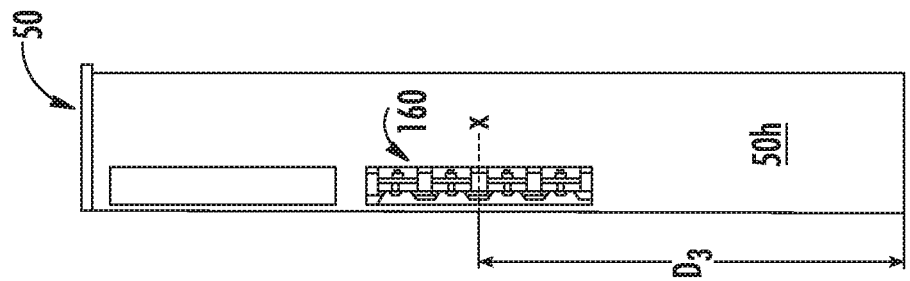
FIG. 8C illustrates the meter stack of the assembly shown in FIG. 8A.
Figure 8B:
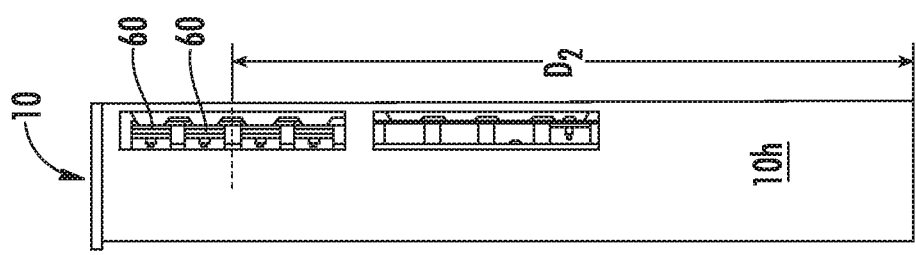
FIG. 8B illustrates the terminal device of the assembly shown in FIG. 8A.
Figure 8A:
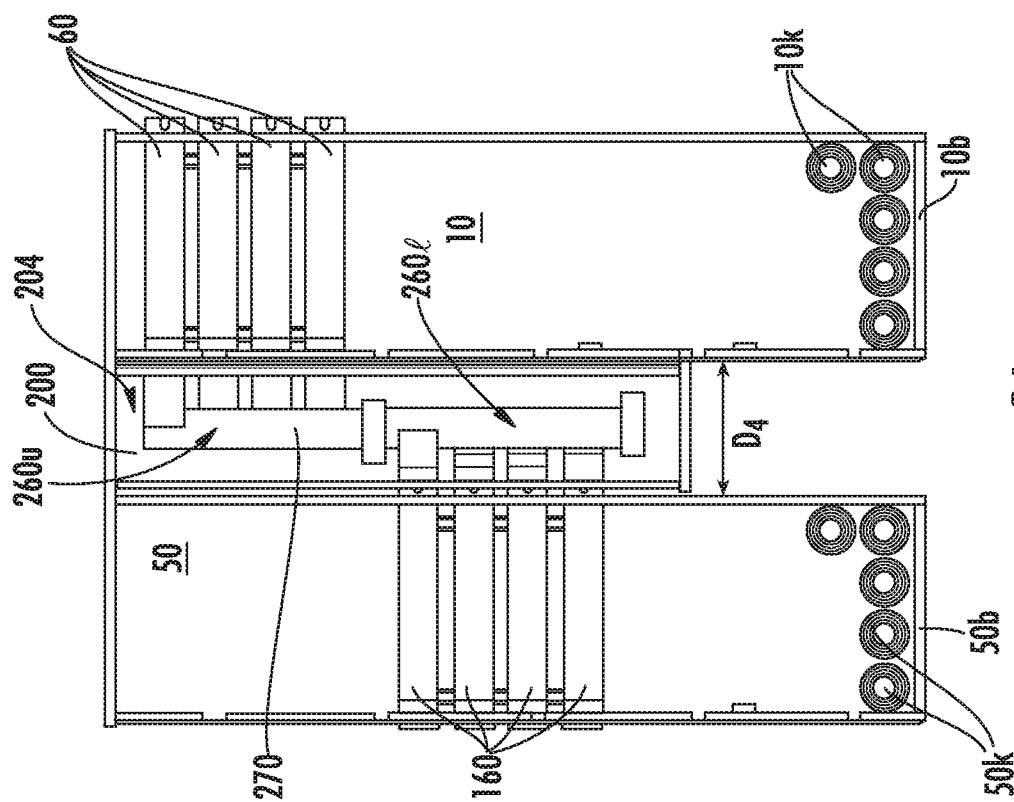
FIG. 8A is a front view of the assembly shown in FIGS. 7A and 7B.

The height adjuster 200 can be used to couple buses 60 in the terminal device 10 at different heights, i.e., terminal devices with higher and lower buses 60 (with the height measured from the bottom or floor) for different defined distances $D_2$ (FIG. 1, FIG. 8B) and the shown heights and locations are by way of example only. Similarly, meter stacks 50 with different bus locations including higher bus and lower buses 160 can be connected with the height adjuster 200 and accommodate different defined distances $D_3$ (FIG. 3, FIG. 8C). Accordingly, the height adjuster 200 can be configured to provide different vertical bus 270 length ranges and connector bus 260 positions for different end users. The height adjuster enclosure 200h can have a compact depth dimension $D_4$ as discussed above.

To be clear, it is also contemplated that the height adjuster 200 can be used for other applications of electrical enclosures using feeder bus lines connecting power lines of power grids and used to provide a different feeder bus height configuration and/or electrical pathway.

Figure 11:
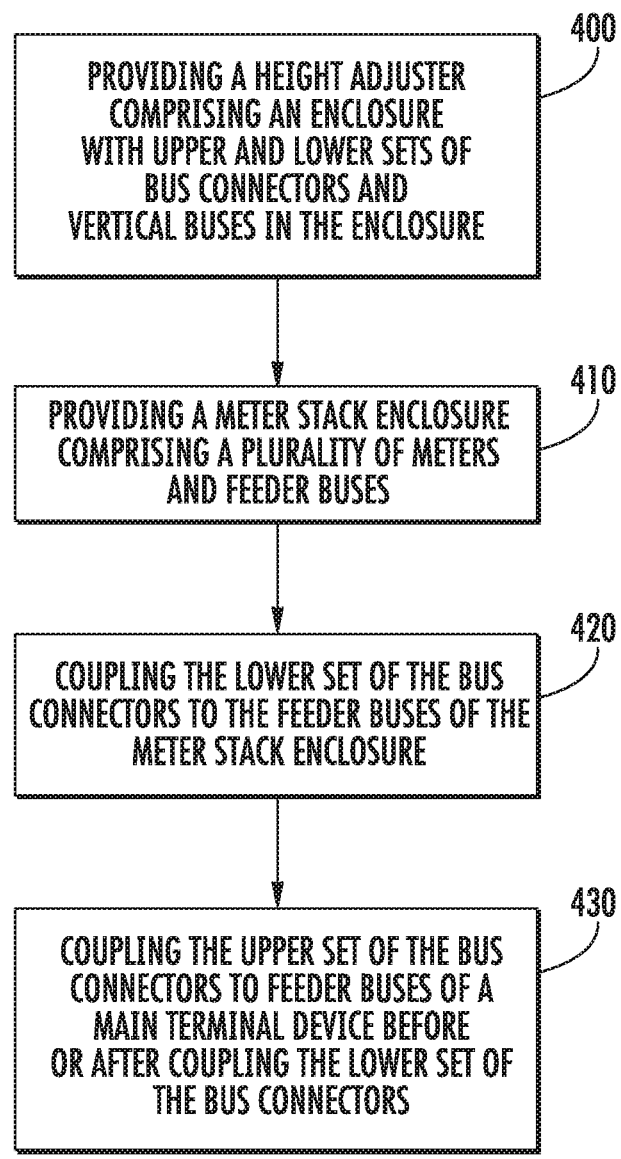
FIG. 11 is an example flow chart of actions that can be carried out according to embodiments of the present invention.

Referring now to FIG. 11, an exemplary method of installing a meter center stack to a main terminal device is shown. A height adjuster comprising an enclosure with upper and lower sets of connector buses and vertical buses in the enclosure is provided (box 400). A meter stack enclosure comprising a plurality of meters is provided (box 410). The lower set of the connector buses is coupled to feeder buses of the meter stack enclosure (box 420). The upper set of the connector buses are coupled to feeder buses of a main terminal device before or after coupling the lower set of the connector buses to the feeder buses of the meter stack (box 430).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A height adjuster comprising:
   a height adjuster enclosure comprising a top, a bottom and first, second, third and fourth walls residing between the top and bottom and surrounding an interior chamber, wherein the first wall and the second wall are parallel to each other and have a width that is less than a width of the third and fourth walls, wherein the first wall comprises at least one through aperture, and wherein the second wall comprises at least one through aperture;
   a plurality of vertical buses that are adjacent to each other and are held in the interior chamber of the height adjuster enclosure;
   an upper set of spaced apart connector buses in the height adjuster enclosure coupled to the plurality of vertical buses and extending across the interior chamber; and
   a lower set of spaced apart connector buses also coupled to the plurality of vertical buses, wherein the lower set of spaced apart connector buses reside under the upper set of spaced apart connector buses in the height adjuster enclosure and extending across the interior chamber.

2. The height adjuster of claim 1, wherein the bottom comprises knockout panel segments, wherein the at least one through aperture of the first wall is aligned with the upper set of spaced apart connector buses, and wherein the at least one through aperture of the second wall is aligned with the lower set of spaced apart connector buses, wherein a free end portion of each of the upper set of connector buses is configured to extend outward toward or through the at least one aperture of the first wall and engage a corresponding feeder bus bar extending from a second enclosure residing adjacent the first wall of the height adjuster enclosure, and wherein a free end portion of each of the lower set of connector buses is configured to extend outward toward or through the at least one aperture of the second wall and engage a corresponding feeder bus bar extending from a third enclosure residing adjacent the second wall of the height adjuster enclosure.

3. The height adjuster of claim 1, wherein the plurality of vertical buses reside in a medial position in the interior chamber and comprise a neutral bus, a phase A bus, a phase B bus, and a phase C bus, and wherein the upper set and lower set of spaced apart connector buses each comprise four spaced apart connector buses, one each of the upper and lower set providing a neutral connector bus, one each of the upper and lower set providing a phase A connector bus, one each of the upper and lower set providing a phase B connector bus, and one each of the upper and lower set providing a phase C connector bus.

4. The height adjuster of claim 1, wherein each of the upper and lower set of spaced apart connector buses has a first end portion and a second end portion connected by an intermediate planar body segment, wherein the planar body segment is orthogonal to the first end portion, wherein the first end portion of one upper connector bus and the first end portion of one lower connector bus is attached to a corresponding one of the plurality of vertical buses, and wherein the second end portion of each connector bus is a free end portion.

5. The height adjuster of claim 1, wherein each of the upper set of connector buses has a planar body segment that has a length which is a different length from others of the upper set of connector buses, and wherein each of the lower set of connector buses has a planar body segment that has a length which is a different length from others of the lower set of connector buses, wherein the length of each planar body segment is associated with a lateral direction extending between the first and second walls.

6. The height adjuster of claim 1, wherein one of the upper set of connector buses and one of the lower set of connector buses has a planar body segment with a common length, and wherein the common length is different from lengths of planar body segments of others of the upper and lower set of connector buses, wherein a respective length of each planar body segment is associated with a lateral direction extending between the first and second walls.

7. The height adjuster of claim 1, further comprising at least one coupler attached to at least one of the first, second, third or fourth walls, wherein the at least one coupler is configured to hold the vertical bus bars in position in the enclosure, wherein the plurality of vertical buses are rectangular vertical bus bars that have primary surfaces that are parallel and in a stacked aligned relationship, and wherein the at least one coupler comprises an electrically insulating material.

8. The height adjuster of claim 7, wherein the at least one coupler is a plurality of vertically spaced apart couplers, and wherein the couplers are monolithic rigid or semi-rigid structures of a defined shape that cooperate to hold the vertical buses in parallel alignment in the enclosure.

9. The height adjuster of claim 7, wherein the at least one coupler comprises a plurality of parallel arms with neighboring pairs of the parallel arms configured to sandwich a respective vertical bus therebetween to thereby hold the vertical buses in position and parallel with each other without requiring any additional fastener attached to the vertical buses.

10. The height adjuster of claim 7, wherein the electrically insulating material comprises a thermoset material.

11. The height adjuster of claim 1, further comprising at least one coupler attached to at least one of the first, second, third or fourth walls, wherein the at least one coupler is configured to hold the vertical bus bars in position in the enclosure, wherein the at least one coupler comprises first and second vertically spaced apart couplers each with a plurality of outwardly extending parallel arms, wherein pairs of the parallel arms form an open gap space therebetween that slidably receives a respective vertical bus, and wherein the pairs of parallel arms with the open gap space of the first coupler face the second wall and the pairs of parallel arms with the open gap space of the second coupler face the first wall.

12. The height adjuster of claim 1, further comprising an insulating member attached to a fastener coupled to one of the connector buses and one of the vertical buses and abutting a neighboring pair of the vertical buses to electrically isolate buses of different phases.

13. The height adjuster of claim 12, wherein the insulating member is a U-shaped member with sidewalls thereof abutting the neighboring pair of the vertical buses.

14. A height adjuster comprising:
 a height adjuster enclosure comprising a top, a bottom and first, second, third and fourth walls residing between the top and bottom and surrounding an interior chamber, wherein the first wall comprises at least one through aperture, and wherein the second wall comprises at least one through aperture;
 a plurality of vertical buses held in the interior chamber of the height adjuster enclosure;
 an upper set of spaced apart connector buses in the height adjuster enclosure coupled to the plurality of vertical buses; and
 a lower set of spaced apart connector buses also coupled to the plurality of vertical buses, wherein the lower set of spaced apart connector buses reside under the upper set of spaced apart connector buses in the height adjuster enclosure,
 wherein the plurality of vertical buses are provided as four vertical bus bars that are adjacent and spaced apart and have a primary surface that is orthogonal to the first and second walls, and wherein the height adjuster enclosure is devoid of any circuit breakers.

15. A meter center assembly for a residential or commercial site, comprising:
 a meter stack enclosure comprising a plurality of meters for measuring electric power consumption; and
 a height adjuster coupled to the meter stack enclosure, wherein the height adjuster comprises:
 a height adjuster enclosure comprising a top, a bottom and first, second, third and fourth walls surrounding an interior chamber and residing between the top and bottom, wherein the first wall and the second wall each comprise at least one through aperture;
 a plurality of vertical buses held in the height adjuster enclosure;
 an upper set of spaced apart connector buses in the height adjuster enclosure coupled to the vertical buses; and
 a lower set of spaced apart connector buses also coupled to the vertical buses, wherein the lower set of spaced apart connector buses reside under the upper set of spaced apart connector buses in the height adjuster enclosure,
 wherein the upper and lower sets of connector buses are devoid of any circuit breakers.

16. The meter center assembly of claim 15, wherein the lower set of the connector buses is coupled to feeder buses of the meter stack enclosure.

17. The meter center assembly of claim 15, further comprising a main terminal enclosure with feeder buses coupled to at least one utility or private power line, wherein the upper set of the connector buses is coupled to the feeder buses in the main terminal enclosure.

18. The meter center assembly of claim 17, wherein the height adjuster enclosure has a depth dimension in a direction between the terminal device enclosure and the meter stack enclosure measured in a range of about 6 to about 9 inches.

19. The meter center assembly of claim 17, wherein the height adjuster holds the plurality of vertical buses laterally spaced apart, aligned and parallel to each other between the third and fourth walls.

20. The meter center assembly of claim 17, wherein the insulating member is a U-shaped member with sidewalls thereof abutting the neighboring pair of the vertical buses.

21. The meter center assembly of claim 15, wherein the vertical buses are parallel, wherein the bottom comprises knockout panel segments, wherein the at least one through aperture of the first wall is aligned with the upper set of spaced apart connector buses, and wherein the at least one through aperture of the second wall is aligned with the lower set of connector buses.

22. The meter center assembly of claim 15, wherein the plurality of vertical buses comprise a neutral bus, a phase A bus, a phase B bus, and a phase C bus, wherein the upper set and lower set of spaced apart connector buses each comprise four spaced apart connector buses, one each of the upper and lower set providing a neutral connector bus, one each of the upper and lower set providing a phase A connector bus, one each of the upper and lower set providing a phase B connector bus, and one each of the upper and lower set providing a phase C connector bus.

23. The meter center assembly of claim 15, wherein the height adjuster further comprises:
at least one coupler attached to at least one of the first and second walls, wherein the plurality of vertical buses are parallel and adjacently positioned, wherein the at least one coupler is configured to hold the vertical bus bars in a stacked aligned position in the enclosure, and wherein the at least one coupler comprises an electrically insulating material; and
at least one insulating member attached to a fastener coupled to one of the connector buses and one of the vertical buses and abutting a neighboring pair of the vertical buses to electrically isolate vertical buses of different phases.

24. The meter center assembly of claim 23, wherein the at least one coupler comprises first and second couplers that are vertically spaced apart and comprise a plurality of parallel arms with neighboring pairs of the parallel arms configured to sandwich a respective vertical bus therebetween.

25. The meter center assembly of claim 24, wherein pairs of the parallel arms form an open gap space therebetween that slidably receives a respective vertical bus to thereby hold the vertical buses in position and parallel with each other without requiring any additional fastener attached to the vertical buses.

26. The meter center assembly of claim 25, wherein the pairs of parallel arms with the open gap space of the first coupler face the second wall and the pairs of parallel arms with the open gap space of the second coupler face the first wall.

27. A method of installing a meter center stack to a main terminal device coupled to at least one power line of a private or public power grid, comprising:
providing a height adjuster comprising an enclosure with upper and lower sets of connector buses and vertical buses in the enclosure, wherein the enclosure of the height adjuster is devoid of any circuit breakers;
coupling the lower set of the connector buses to feeder buses of the meter center stack; and
coupling the upper set of the connector buses to feeder buses of the main terminal device before or after coupling the lower set of the connector buses.

\* \* \* \* \*